(12) United States Patent
Liang et al.

(10) Patent No.: US 7,949,929 B2
(45) Date of Patent: May 24, 2011

(54) CONTROLLER AND STORAGE DEVICE HAVING THE SAME

(75) Inventors: Ming-Jen Liang, Hsinchu (TW); Wee-Kuan Gan, Hsinchu (TW); Chih-Jen Hsu, Hsinchu (TW)

(73) Assignee: Phison Electronics Corp., Miaoli (TW)

( * ) Notice: Subject to any disclaimer, the term of this patent is extended or adjusted under 35 U.S.C. 154(b) by 982 days.

(21) Appl. No.: 11/758,016

(22) Filed: Jun. 5, 2007

(65) Prior Publication Data

US 2007/0266297 A1 Nov. 15, 2007

Related U.S. Application Data

(63) Continuation-in-part of application No. 10/710,860, filed on Aug. 9, 2004, now Pat. No. 7,263,649.

(51) Int. Cl.
G11C 29/00 (2006.01)

(52) U.S. Cl. ........................................................ 714/769

(58) Field of Classification Search .................. 714/746, 714/755, 763, 769
See application file for complete search history.

(56) References Cited

U.S. PATENT DOCUMENTS

2004/0255225 A1* 12/2004 Takai ............................ 714/763
* cited by examiner Primary Examiner — Shelly A Chase
(74) Attorney, Agent, or Firm — Jianq Chyun IP Office

(57) ABSTRACT

A controller for controlling an access of a non-volatile memory having an error-correcting code area and a data area is provided. The controller includes an error-correcting module and a first inverting circuit electrically connected to the error-correcting module for inverting data and error-correcting codes corresponding to the data. When the controller both writes all 0xFF data in the data area and writes all 0xFF error-correcting codes in the error-correcting code area, the first inverting circuit inverts the all 0xFF data and the all 0xFF error-correcting codes into all 0x00 data and all 0x00 error-correcting codes, respectively.

20 Claims, 3 Drawing Sheets

CONTROLLER AND STORAGE DEVICE HAVING THE SAME

CROSS-REFERENCE TO RELATED APPLICATION

This application is a continuation-in-part of a prior application Ser. No. 10/710,860, filed on Aug. 9, 2004. All disclosures are incorporated therewith.

BACKGROUND OF THE INVENTION

1. Field of the Invention

The present invention generally relates to a controller and a storage device having the same. More particularly, the present invention relates to a controller and a storage device having the same for preventing wrong error-correcting codes from occurring due to an error-correcting module during data reading operation.

2. Description of Related Art

The flash memory is popular because of its advantageous characteristics, such as low power consumption, non-volatility, shock tolerance and high storage density. The flash memory has gradually replaced an EEPROM or a battery powered memory in majority portable devices. And the mature semiconductor technology allows further increased storage density and transmission speed of the flash memory. Thus, the flash memory has successfully replaced the traditional storage media, such as the hard disk.

For maintaining completeness of the data stored in the flash memory, error-correcting codes (ECCs) are provided. The ECC is a code in which each data signal conforms to specific rules of construction so that departures from this construction in the received signal can generally be automatically detected and corrected. It is used in computer data storage, for example, in a dynamic RAM, and in data transmission. Examples include Hamming codes, BCH codes, Reed-Solomon codes, Reed-Muller codes, Binary Golay codes, convolutional codes, and turbo codes. The simplest error-correcting codes can correct single-bit errors and detect double-bit errors. Other codes can detect or correct multi-bit errors.

Generally, a unit for storing data in a memory is byte (1 byte=8 bits) and one byte is represented with two hexadecimal numbers in a computer system. In a process of fabricating a portable storage device using the flash memory as a storing medium, an erase command must be executed to convert values of data in a data area and an error-correcting code area of the flash memory into all 0xFF. However, because the error-correcting codes corresponding data having all 0xFF of values generally are not all 0xFF, the error-correcting module may determinate that there are parity errors in the data, or even worse, the reading operation cannot be executed after performing the erase operation.

Therefore, it is highly desirable to prevent the wrong determination by the error-correcting module after the erase operation is performed.

SUMMARY OF THE INVENTION

Accordingly, the present invention is directed to a controller for preventing a wrong determination by an error-correcting module after an erase operation.

The present invention is further directed to a storage device having the controller for preventing a wrong determination by an error-correcting module after an erase operation.

According to an embodiment of the present invention, a controller for controlling an access of a non-volatile memory having an error-correcting code area and a data area is provided. The controller comprises an error-correcting module for performing an error-correcting operation and a first inverting circuit electrically connected to the error-correcting module for inverting data and error-correcting codes corresponding to the data. When the controller both reads all 0xFF data in the data area and reads all 0xFF error-correcting codes in the error-correcting code area, the first inverting circuit inverts the all 0xFF data and the all 0xFF error-correcting codes into all 0x00 data and all 0x00 error-correcting codes before performing the error-correcting operation, respectively.

In an embodiment of the present invention, the controller further comprises a buffer for temporarily storing data to be written in the data area and data to be read form the data area.

In an embodiment of the present invention, the controller further comprises a second inverting circuit for inverting the data inverted by the first inverting circuit.

According to an embodiment of the present invention, a storage device is provided. The storage device comprises a controller including an error-correcting module for performing an error-correcting operation and a first inverting circuit electrically connected to the error-correcting module for inverting data and error-correcting codes corresponding to the data, and a non-volatile memory including an error-correcting code area electrically connected to the controller for storing the error-correcting codes generated by the error-correcting module and a data area electrically connected to the controller for storing the data transmitted by the controller. When the controller both reads all 0xFF data in the data area and reads all 0xFF error-correcting codes in the error-correcting code area, the first inverting circuit inverts the all 0xFF data and the all 0xFF error-correcting codes into all 0x00 data and all 0x00 error-correcting codes before performing the error-correcting operation, respectively.

In an embodiment of the present invention, the controller further comprises a buffer for temporarily storing data to be written in the data area and data to be read form the data area.

In an embodiment of the present invention, the controller further comprises a second inverting circuit for inverting the data inverted by the first inverting circuit.

In an embodiment of the present invention, the non-volatile memory is a flash memory.

In an embodiment of the present invention, the flash memory is a NAND flash memory.

In an embodiment of the present invention, the NAND flash memory is a Single Level Cell (SLC) or a Multi Level Cell (MLC) NAND flash memory.

In an embodiment of the present invention, the storage device further comprises a data transmission interface used for transmitting/receiving the data between the controller and a host.

In an embodiment of the present invention, the data transmission interface includes a USB interface, an IEEE 1394 interface, a SATA interface, a PCI Express interface, a mobile memory stick (MS) interface, a Secure Digital (SD) interface, a Multi Media Card (MMC) interface, a Compact Flash (CF) interface or an Integrated Drive Electronics (IDE) interface.

According to an embodiment of the present invention, a storage device is further provided. The storage device comprises a controller including an error-correcting module having a set of parameters, and a non-volatile memory including an error-correcting code area electrically connected to the controller for storing error-correcting codes generated by the error-correcting module and a data area electrically connected to the controller for storing data transmitted by the controller. When data input to the error-correcting module having the set of the parameters are all 0xFF, the error-correcting module having the set of the parameters outputs the error-correcting codes which are all 0xFF, wherein the predetermined value is calculated based on an error-correcting algorithm implemented by the error-correcting module.

In an embodiment of the present invention, the non-volatile memory is a flash memory.

In an embodiment of the present invention, the flash memory is a NAND flash memory.

In an embodiment of the present invention, the NAND flash memory is a Single Level Cell (SLC) or a Multi Level Cell (MLC) NAND flash memory.

In an embodiment of the present invention, the controller further comprises a buffer for temporarily storing data to be written in the data area and data to be read form the data area.

In an embodiment of the present invention, the storage further comprises a data transmission interface for transmitting/receiving the data between the controller and a host.

In an embodiment of the present invention, the data transmission interface includes a USB interface, an IEEE 1394 interface, a SATA interface, a PCI Express interface, a MS interface, a SD interface, a MMC interface, a CF interface or an IDE interface.

The present invention provides the controller having the inverting circuits and the storage device having the same. By inverting the data stored in the storage device, it is possible for preventing a wrong determination by the error-correcting module after the erase operation. Moreover, the present invention also provides the storage device including the error-correcting module having the predetermined parameters. By setting the predetermined parameter based on the error-correcting algorithm implemented, it is possible for preventing a wrong determination by the error-correcting module after the erase operation.

Additional aspects and/or advantages of the invention will be set forth in part in the description which follows and, in part, will be obvious from the description, or may be learned by practice of the invention.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
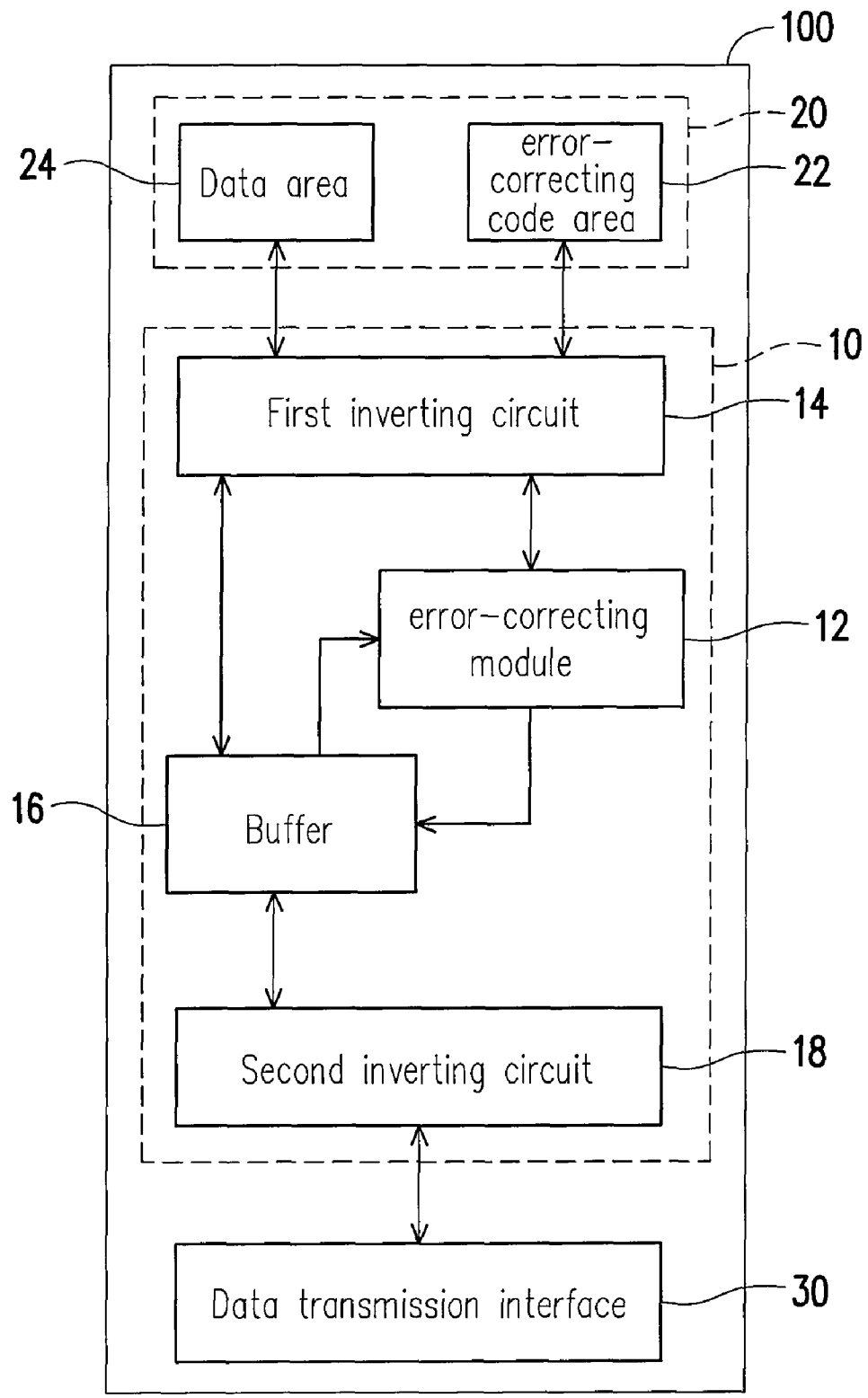
FIG. 1 illustrates a block diagram of a storage device according to a first exemplary embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1 illustrates a block diagram of a storage device according to a first exemplary embodiment of the present invention.

Referring to FIG. 1, a storage device 100 includes a controller 10 and a non-volatile memory 20 according to the first exemplary embodiment of the present invention.

The controller 10 includes an error-correcting module 12 and a first inverting circuit 14. The error-correcting module 12 may generate error-correcting codes corresponding to data and store the error-correcting codes corresponding to the data in the storage device 100 when the data is written in the storage device 100. In particular, the error-correcting codes are used for determining whether there are parity errors in the data by the controller 10 when the data is read from the storage device 100 and the error-correcting codes are also used for correcting the errors by the controller 10 if there are the errors in the data.

The first inverting circuit 14 is electrically connected to the error-correcting module 12 and can invert the data storing in the storage device 100 and the error-correcting codes corresponding to the data. In particular, the first inverting circuit 14 can invert the all 0xFF data and the all 0xFF error-correcting codes into all 0x00 data and all 0x00 error-correcting codes.

In the embodiment of the present invention, the controller 10 further includes a buffer 16. The buffer 16 is used for temporarily storing data to be written in the data area and data to be read from the data area.

For example, the controller 10 further includes a second inverting circuit 18. The second inverting circuit 18 is electrically connected with the buffer 16. The function and the structure of the second inverting circuit 18 are the same as those of the first inverting circuit 14. By inverting again, phases of data stored in the storage device 100 are the same as those of data shown in a host.

The non-volatile memory 20 includes an error-correcting code area 22 and a data area 24. The error-correcting code area 22 is electrically connected to the controller 10 and is used for storing the error-correcting codes generated by the error-correcting module 12. The data area 24 is electrically connected to the controller 10 and is used for storing the data written by the controller 10. Thus, when the controller 10 writes the data in the non-volatile memory 20, the data is stored in the data area 24 and the error-correcting codes corresponding to the data are stored in the error-correcting code area 22. In the embodiment of the present invention, the non-volatile memory 20 is a NAND flash memory. In particularly, the NAND flash memory is a Single Level Cell (SLC) or a Multi Level Cell (MLC) NAND flash memory. However, it is understood that the non-volatile memory may be other flash memories or any recordable mediums.

Figure 2:
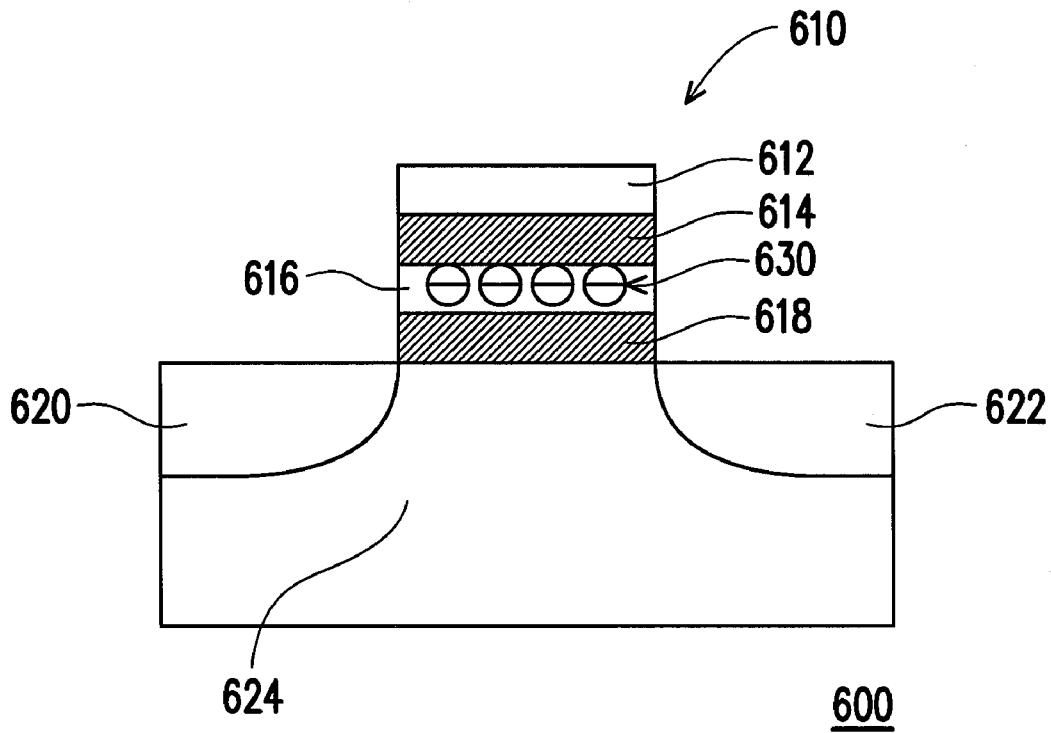
FIG. 2 illustrates a schematic diagram of a conventional flash memory.

FIG. 2 illustrates a schematic diagram of a conventional flash memory cell. Referring to FIG. 2, a basic flash memory cell 600 includes a transistor 610 characterized by a specific threshold voltage (Vt) level. The transistor 610 includes a gate layer 612, an inter-gate dielectric layer 614, a floating gate 616, a gate dielectric layer 618, a source electrode 620, a drain electrode 622 and a substrate 624. Electrical charge 630 is stored on the floating gate 616.

Figure 3:
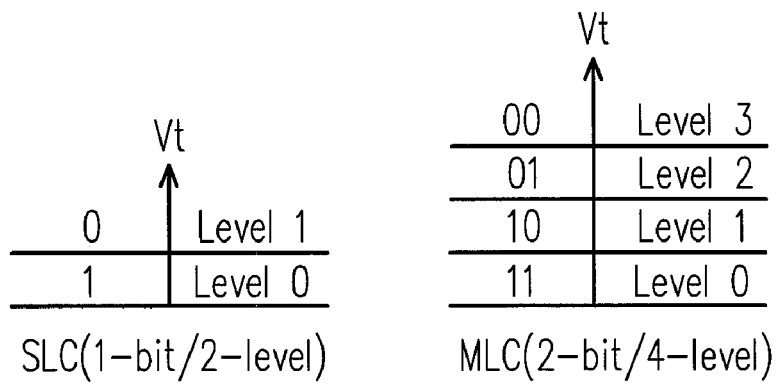
FIG. 3 illustrates a chart comparing single level cell (SLC) and multi level cell (MLC) technologies.

Typical flash memory uses single level cell (SLC) flash memory with Vt levels such as shown in FIG. 3. A multi level cell (MLC) technology enables storage of multiple bits per cell by charging the floating gate of a transistor to more than two levels by precisely controlled injection of electrical charges. Two bit MLC has four voltage levels and N bit MLC has $2^N$ voltage levels. MLC effectively reduces cell area as well as the die size for a given cell density and leads to a significantly reduced unit cost-per-megabyte. This is important for devices such as mass storage, where concerns of space and cost prevail. As there are more voltage levels in MLC, an enhanced ECC/EDC may be need to account for better data reliability and the longer programming time needed to manipulate the voltage levels.

In the embodiment of the present invention, the storage device 100 further includes a data transmission interface 30. The data transmission interface 30 is electrically connected to the controller 10 and used for transmitting/receiving the data between the controller 10 and a host. The data transmission interface 30 may be a USB interface, an IEEE 1394 interface, a SATA interface, a PCI Express interface, a MS interface, a SD interface, a MMC interface, a CF interface, an IDE interface or other data transmission interfaces.

In the embodiment of the present invention, when the controller 10 executes a write command from the host (not shown) for writing the data in the non-volatile memory 20, the data is first inverted by the second inverting circuit 18 and then stored in the buffer 16. Next, the inverted data stored in the buffer 16 is inverted by the first inverting circuit 14 and written into the data area 24 of the non-volatile memory 20. Meanwhile, the inverted data stored in the buffer 16 is transmitted into the error-correcting module 12 and the error-correcting module 12 generates a set of the error-correcting codes corresponding to the inverted data. Then, the error-correcting codes corresponding to the inverted data are inverted by the first inverting circuit 14 and written into the error-correcting code area 22 of the non-volatile memory 20.

For example, the data (1, 2, 3, 4) to be written first is inverted by the second inverting circuit 18 and then the inverted data (E, D, C, B) is stored in the buffer 16. Next, the inverted data (E, D, C, B) stored in the buffer 16 is inverted by the first inverting circuit 14 and written into the data area 24 of the non-volatile memory 20. That is, the data written in the data area 24 is (1, 2, 3, 4). Meanwhile, the error-correcting module 12 generates a set of the error-correcting codes ECC (E, D, C, B) by a function of an ECC algorithm corresponding to the inverted data (E, D, C, B). Then, the error-correcting codes ECC (E, D, C, B) are inverted by the first inverting circuit 14 and written into the error-correcting code area 22 of the non-volatile memory 20. As described above, the phases of data stored in the storage device 100 are the same as those of the data shown in the host.

In the embodiment of the present invention, when the controller 10 executes a read command from the host (not shown) for reading data from the non-volatile memory 20, the data stored in the data area 24 of the non-volatile memory 20 is inverted by the first inverting circuit 14 and stored in the buffer 16. Meanwhile, the error-correcting codes corresponding to the data, stored in the error-correcting code area 22 of the non-volatile memory 20, are inverted by the first inverting circuit 14 and transmitted to the error-correcting module 12 with the inverted data. Then, the error-correcting module 12 may decode the data and the error-correcting codes to determinate whether there are parity errors in the data. If there are parity errors in the data, the error-correcting module 12 can promptly correct the errors in the data stored in the buffer 16. Finally, the data stored in the buffer 16 is inverted by the second inverting circuit 18 and transmitted to the host via the data transmission interface 30.

For example, the data (1, 2, 3, 4) stored in the data area 24 to be read is inverted by the first inverting circuit 14, and the inverted data (E, D, C, B) is stored in the buffer 16. Meanwhile, the error-correcting codes ECC (1, 2, 3, 4) corresponding to the data (1, 2, 3, 4), stored in the error-correcting code area 22 of the non-volatile memory 20, are inverted by the first inverting circuit 14, and the inverted error-correcting codes are transmitted to the error-correcting module 12 with the inverted data (E, D, C, B). Then, the error-correcting module 12 may decode the data (E, D, C, B) and the error-correcting codes to determinate whether there are parity errors in the data. In the example, there are no parity errors in the data. Then, the data (E, D, C, B) stored in the buffer 16 is directly inverted by the second inverting circuit 18 without being corrected, and the inverted data (1, 2, 3, 4) is transmitted to the host. As described above, data is still written and read correctly with the inverting circuits in the storage device.

According to the above description, when the controller 10 executes an erase command from the host (not shown) for erasing all of data in the non-volatile memory 20, all 0xFF data and all 0xFF error-correcting codes are written in the data area and the error-correcting code area, respectively. When the controller 10 read data from the non-volatile memory 20, the all 0xFF data and the all 0xFF error-correcting codes are inverted by the first inverting circuit 14 into all 0x00 data and all 0x00 error-correcting codes, respectively. Then, when the all 0x00 data and the all 0x00 error-correcting codes are transmitted to the error-correcting module 12 to determinate whether there are parity errors in the data, the error-correcting module 12 will determinate that there are not any parity errors in the data because the error-correcting codes corresponding to the all 0x00 data are all 0x00.

In the embodiment of the present invention, when values of the data in the data area and the error-correcting code area of the flash memory are all 0xFF due to the erase operation, the first inverting circuit 14 may invert the values of the data in the data area and the error-correcting code area of the flash memory into all 0x00 in a reading operation. A wrong determination by the error-correcting module is prevented after the erase operation because the error-correcting codes corresponding to the data having all 0x00 of values are all 0x00 in the error-correcting module.

Figure 4:
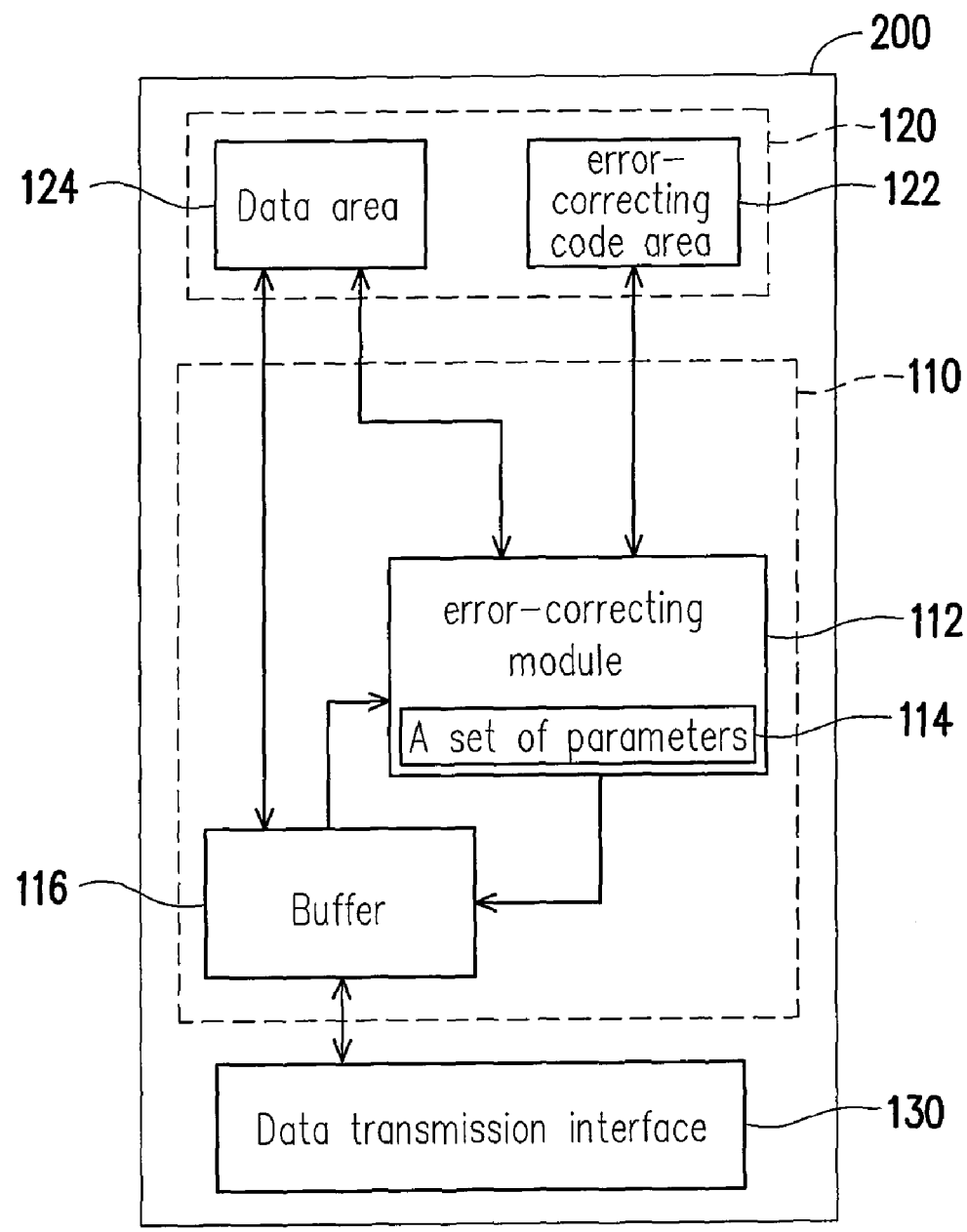
FIG. 4 illustrates a block diagram of a storage device according to a second exemplary embodiment of the present invention.

FIG. 4 illustrates a block diagram of a storage device according to a second exemplary embodiment of the present invention.

Referring to FIG. 4, a storage device 200 includes a controller 110 and a non-volatile memory 120 according to the second exemplary embodiment of the present invention.

The controller 110 includes an error-correcting module 112. The error-correcting module 112 may generate error-correcting codes corresponding to data and store the error-correcting codes corresponding to the data in the storage device 200 when the data is written in the storage device 200. Additionally, the error-correcting codes are used for determining whether there are errors in the data by the controller 110 when the data is read from the storage device 200 and the error-correcting codes are used for correcting the errors by the controller 110 if there are parity errors in the data. In particular, the error-correcting module 112 includes a set of parameters 114, and the error-correcting module 112 having the set of the parameters 114 may generate all 0xFF error-correcting codes when all 0xFF data is input to the error-correcting module 112. Additionally, the set of the parameters 114 are changed depending on the error-correcting algorithm designed in the error-correcting module 112. In other words, the set of the parameters 114 are variably set based on different error-correcting algorithms.

More specificity, the error-correcting algorithm may be referred to a division operator and the set of the parameters 114 may be referred to default values for the division operator. Accordingly, in the case where input data is 10, error-correcting module is 7 and the default value is 0, output data calculated based on the error-correcting algorithm will be 3 (i.e., (10+0)/7=3). Thus, for example, if the output data is required to be 0 in the case where input data is 10 and error-correcting module is 7, the default value must be set into 4

(i.e., (10+4)/7=0). In the embodiment of the present invention, the set of the parameters 114 are found such that output data output from error-correcting module 112 is all 0xFF in the case where input data is all 0xFF.

In the embodiment of the present invention, the controller 110 further includes a buffer 116. The buffer 116 is used for temporarily storing data to be written in the data area and data to be read form the data area.

The non-volatile memory 120 includes an error-correcting code area 122 and a data area 124. The error-correcting code area 122 is electrically connected to the controller 110 and is used for storing the error-correcting codes generated by the error-correcting module 112. The data area 124 is electrically connected to the controller 110 and is used for storing the data written by the controller 110. More specifically, when the controller 110 writes the data in the non-volatile memory 120, the data is stored in the data area 124 and the error-correcting codes corresponding to the data are stored in the error-correcting code area 122. In the embodiment of the present invention, the non-volatile memory 120 is a NAND flash memory. In particularly, the NAND flash memory is a Single Level Cell (SLC) or a Multi Level Cell (MLC) NAND flash memory. However, it is understood that the non-volatile memory may be other flash memories or any recordable mediums.

In the embodiment of the present invention, the storage device 200 further includes a data transmission interface 130. The data transmission interface 130 is electrically connected to the controller 110 and used for transmitting/receiving the data between the controller 110 and a host. The data transmission interface 130 may be a USB interface, an IEEE 1394 interface, a SATA interface, a PCI Express interface, a MS interface, a SD interface, a MMC interface, a CF interface, an IDE interface or other data interfaces.

In the embodiment of the present invention, when the controller 110 executes a write command from the host (not shown) for writing the data in the non-volatile memory 120, the data is written into the data area 124 of the non-volatile memory 120 via the buffer 116. Meanwhile, the data is also transmitted into the error-correcting module 112 via the buffer 116, and the error-correcting module 112 generates a set of the error-correcting codes corresponding to the data. Then, the error-correcting codes corresponding to the data are written into the error-correcting code area 122 of the non-volatile memory 120.

In the embodiment of the present invention, when the controller 110 executes a read command from the host (not shown) for reading the data from the non-volatile memory 120, the data stored in the data area 124 of the non-volatile memory 120 is transmitted to the buffer 16. Meanwhile, the error-correcting codes corresponding to the data, stored in the error-correcting code area 122 of the non-volatile memory 120, are transmitted to the error-correcting module 112 with the data. Then, the error-correcting module 12 may decode the data and the error-correcting codes to determinate whether there are parity errors in the data. If there are parity errors in the data, the error-correcting module 112 can promptly correct the errors in the data stored in the buffer 116. Finally, the data stored in the buffer 116 is transmitted to the host via the data transmission interface 130.

According to the above description, when the controller 110 executes a erase command from the host (not shown) for erasing all of the data in the non-volatile memory 120, all 0xFF data and all 0xFF error-correcting codes are written in the data area and written in the error-correcting code area, respectively. Then, when the all 0x FF data and the all 0xFF error-correcting codes are transmitted to the error-correcting module 112 to determinate whether there are parity errors in the data, the error-correcting module 112 will determinate that the parity errors are not in the data because the error-correcting codes corresponding to the all 0xFF data are all 0xFF.

In the embodiment of the present invention, the error-correcting module 112 has a set of parameter values variably set depending on different error-correcting algorithms such that the error-correcting codes corresponding to the data having all 0x FF of values are all 0xFF. Therefore, a wrong determination by the error-correcting module after the erase operation is prevented.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims and their equivalents.

What is claimed is:

1. A controller for controlling an access of a non-volatile memory having an error-correcting code area and a data area, comprising:
   an error-correcting module for performing an error-correcting operation; and
   a first inverting circuit electrically connected to the error-correcting module for inverting data and error-correcting codes corresponding to the data,
   wherein when the controller both reads all 0xFF data in the data area and reads all 0xFF error-correcting codes in the error-correcting code area, the first inverting circuit inverts the all 0xFF data and the all 0xFF error-correcting codes into all 0x00 data and all 0x00 error-correcting codes before performing the error-correcting operation, respectively.

2. The controller according to claim 1, further comprising a buffer for temporarily storing data to be written in the data area and data to be read form the data area.

3. The controller according to claim 1, further comprising a second inverting circuit for inverting the data inverted by the first inverting circuit.

4. A storage device, comprising:
   a controller, comprising:
      an error-correcting module for performing an error-correcting operation; and
      a first inverting circuit electrically connected to the error-correcting module for inverting data and error-correcting codes corresponding to the data; and
   a non-volatile memory, comprising:
      an error-correcting code area electrically connected to the controller for storing the error-correcting codes generated by the error-correcting module; and
      a data area electrically connected to the controller for storing the data transmitted by the controller,
   wherein when the controller both reads all 0xFF data in the data area and reads all 0xFF error-correcting codes in the error-correcting code area, the first inverting circuit inverts the all 0xFF data and the all 0xFF error-correcting codes into all 0x00 data and all 0x00 error-correcting codes before performing the error-correcting operation, respectively.

5. The storage device according to claim 4, wherein the controller further comprises a buffer for temporarily storing data to be written in the data area and data to be read form the data area.

6. The storage device according to claim 4, wherein the controller further comprises a second inverting circuit for inverting the data inverted by the first inverting circuit.

7. The storage device according to claim 4, wherein the non-volatile memory is a flash memory.

8. The storage device according to claim 7, wherein the flash memory is a NAND flash memory.

9. The storage device according to claim 8, wherein the NAND flash memory is a Multi Level Cell (MLC) NAND flash memory.

10. The storage device according to claim 8, wherein the NAND flash memory is a Single Level Cell (SLC) NAND flash memory.

11. The storage device according to claim 4, further comprising a data transmission interface for transmitting or receiving the data between the controller and a host.

12. The storage device according to claim 11, wherein the data transmission interface includes a USB interface, an IEEE 1394 interface, a SATA interface, a PCI Express interface, a Memory Stick (MS) interface, a Secure Digital (SD) interface, a Multi Media Card (MMC) interface, a Compact Flash (CF) interface or an Integrated Drive Electronics (IDE) interface.

13. A storage device, comprising:
a controller, comprising an error-correcting module having a set of parameters, wherein the error-correcting module is used for performing an error-correcting operation; and
a non-volatile memory, comprising:
an error-correcting code area electrically connected to the controller for storing error-correcting codes generated by the error-correcting module; and
a data area electrically connected to the controller for storing data transmitted by the controller,
wherein when data input to the error-correcting module having the set of the parameters are all 0xFF, the error-correcting module having the set of the parameters outputs error-correcting codes which are all 0xFF, and
wherein the parameters are calculated based on an error-correcting algorithm implemented by the error-correcting module.

14. The storage device according to claim 13, wherein the non-volatile memory is a flash memory.

15. The storage device according to claim 14, wherein the flash memory is a NAND flash memory.

16. The storage device according to claim 15, wherein the NAND flash memory is a Multi Level Cell (MLC) NAND flash memory.

17. The storage device according to claim 15, wherein the NAND flash memory is a Single Level Cell (SLC) NAND flash memory.

18. The storage device according to claim 13, wherein the controller further comprises a buffer for temporarily storing data to be written in the data area and data to be read form the data area.

19. The storage device according to claim 13, further comprising a data transmission interface for transmitting or receiving the data between the controller and a host.

20. The storage device according to claim 19, wherein the data transmission interface includes a USB interface, an IEEE 1394 interface, a SATA interface, a PCI Express interface, a Memory Stick (MS) interface, a Secure Digital (SD) interface, a Multi Media Card (MMC) interface, a Compact Flash (CF) interface or an Integrated Drive Electronics (IDE) interface.

* * * * *